United States Patent

Forhan et al.

[11] Patent Number: 5,982,225
[45] Date of Patent: Nov. 9, 1999

[54] HOT ELECTRON COMPENSATION FOR IMPROVED MOS TRANSISTOR RELIABILITY

[75] Inventors: Timothy E. Forhan, Colchester; Terence B. Hook, Jericho Center; Steven W. Mittl; Edward J. Nowak, both of Essex, all of Vt.; Madhu Sayala, Allen, Tex.; Ronald A. Warren, Essex Junction, Vt.

[73] Assignee: International Business Machines Corporation, Armonk, N.Y.

[21] Appl. No.: 08/907,149

[22] Filed: Aug. 6, 1997

[51] Int. Cl.[6] .................... H03K 17/06; H03K 17/687
[52] U.S. Cl. ........................... 327/538; 327/543
[58] Field of Search .................. 327/538, 540, 327/541, 543, 530

[56] References Cited

U.S. PATENT DOCUMENTS 4,704,547  11/1987  Kirsch ........................... 326/9
5,640,122  6/1997  McClure ........................ 327/530

*Primary Examiner*—Tuan T. Lam
*Attorney, Agent, or Firm*—Whitham, Curtis & Whitman; Eugene I. Shukurko

[57] ABSTRACT

A circuit actively monitors and measures the amount of MOS device degradation due to, for example, the hot electron effect, and makes compensatory adjustments to device voltage levels or clock speed to maintain desired levels of functionality and performance. Monitoring can be done separately for NFET and PFET devices to selectively adjust for different degradation rates between the two. In operation, the monitor circuit compares the performance of a stressed device to a reference device, that is, an unstressed device which has not been degraded by the hot-electron effect. The monitor circuit outputs a signal indicating the amount of device degradation. This signal is used to adjust the supply voltage to that device or to the chip or otherwise compensate for the degradation. The monitor circuit can be formed on-chip or off-chip.

18 Claims, 2 Drawing Sheets

HOT ELECTRON COMPENSATION FOR IMPROVED MOS TRANSISTOR RELIABILITY

BACKGROUND OF THE INVENTION

1. Field of the Invention

The present invention generally relates to MOS semiconductor devices and, more particularly, to increasing the useful life of a semiconductor device by monitoring and compensating for degradation due to the hot-electron effect.

2. Description of the Related Art

The "hot-electron" effect is a wear out mechanism that degrades metal-oxide semiconductor field effect transistor (MOSFET, or simply MOS) device performance as a function of applied voltage over time. Device threshold voltages and drive currents change with time and eventually cause the device to cease functioning within its design parameters. The hot-electron effect limits the usable applied voltage and therefore hampers device performance, and shortens the usable lifetime at a given applied voltage.

As MOS semiconductor devices become smaller and more highly integrated, degradation from the hot-electron effect has a greater impact due to the proportionately larger voltages and, thus larger fields, experienced by the smaller devices. As a result of these larger fields, some channel carriers (holes or electrons) have enough energy to enter the oxide insulating layer near the drain. For example, in p-type MOSFET devices (PFETs), holes may become trapped in the oxide layer resulting in a positive oxide charge near the drain which reduces the capacity of the channel and degrades device performance. Similarly, in n-type MOSFET devices (NFETs), electrons may become trapped in the oxide layer creating interface traps, eventually leading to gate-to-drain short circuits resulting in device failure.

In order to combat the hot-electron effect several solutions have been devised. Relatively simple solutions involve merely seeking to minimize the damage due to the hot-electron effect, such as by limiting the device channel length. More elaborate solutions involve the so-called lightly doped drain (LDD) wherein a lightly doped extension of the drain is inserted between the channel and the drain. The LDD is designed to spread the drain-to-channel voltage drop as evenly as possible in order to reduce any peaks in the field in order to keep the number of energetic carriers, holes or electrons, available to become trapped in the oxide layer to a minimum. However, the LDD solution increases drain resistance and decreases device gain thereby altering device performance.

SUMMARY OF THE INVENTION

It is therefore an object of the present invention to provide a circuit to compensate for the hot-electron effect such that the device operates within its design parameters throughout its lifetime.

It is yet another object of the present invention to improve MOS device performance throughout its lifetime.

It is yet another object of the present invention to increase the useful lifetime of a MOS device at a given performance level.

The present invention is directed to a monitor circuit which actively monitors and measures the amount of MOS device degradation and makes compensatory adjustments to device voltage levels to manage or maintain desired levels of functionality and performance. Monitoring can be done separately for NFET and PFET devices to selectively adjust for different degradation rates between the two. In operation, a monitor circuit compares the performance of a sample device subject to the hot-electron effect to a reference device, that is, an unstressed device which has not been degraded by the hot-electron effect. The monitor circuit outputs a signal indicating the amount of device degradation. This signal can be used to make compensatory adjustments to the operating parameters, such as to adjust the supply voltage to the device or to the chip containing the device, the temperature of the chip or the device, MOSFET well voltages of the chip or the device, or to adjust the clock rate of the device to compensate for performance as the device ages. The monitor circuit can be formed on-chip or off-chip.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
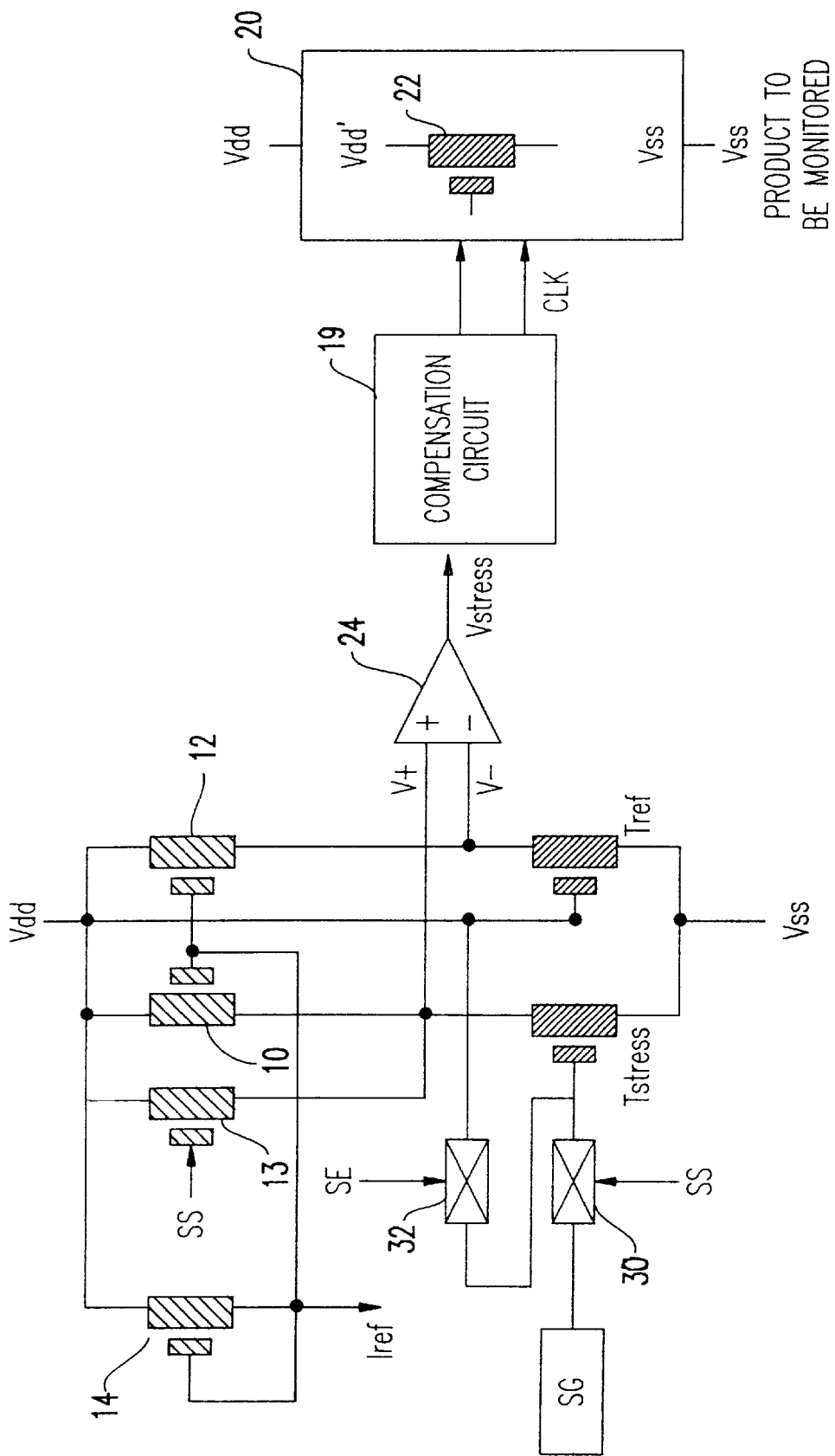
FIG. 1 is circuit diagram showing MOS degradation detection circuitry according to the present invention.

Referring now to the drawings, and more particularly to FIG. 1, there is shown a circuit diagram showing the MOS degradation detection circuitry according to the present invention. A product 20 to be monitored comprises, in this example, an NFET transistor 22 subject to the hot electron effect. During operation, the product's 20 positive and negative power supply leads are connected to Vdd and Vss, respectively.

The monitoring circuit comprises two transistors labeled as $T_{stress}$ and $T_{Ref}$, both of which are the same type as the transistor 22 to be monitored. $T_{stress}$ is subjected to voltages which induce the hot-electron effect and degrade $T_{stress}$ over time just as transistor 22 will experience over its lifetime. An appropriate signal, such as the product clock, or a D.C. bias, or both may be applied to SG so that the n-type MOSFET, $T_{stress}$, is degraded by the hot-electron effect.

Transmission gates 30 and 32 are switched to alternately connect the gate of $T_{Stress}$ to either a non-stress inducing voltage, such as the MOS supply voltage Vdd, or to a stress inducing voltage SG. When signal SS is activated, $T_{Stress}$ is connected to voltage SG and PFET transistor 13 is also activated to provide high drain fields during stress. Transmission gate 32 is turned off by signal SE. Periodically, SS and SE are altered to switch off transistor 13 and transmission gate 30 and turn on 32. A current mirror comprised of transistors 10, 12, and 14 allow a value of current, $I_{ref}$, to exist through both $T_{Ref}$ and $T_{Stress}$. $T_{Ref}$ and $T_{Stress}$ are designed to be identical and hence the differential signal into the differential amplifier 24 will be zero.

However, as $T_{Stress}$ begins to degrade, a differential voltage will begin to appear between V+ and V− of the differential amplifier 24. Since the gates of $T_{Stress}$ and $T_{Ref}$ are connected to Vdd during differential amplifier 24 readout, $I_{ref}$ can easily be made sufficiently low so that both NFETs $T_{Stress}$ and $T_{Ref}$ are in linear operation, thereby emphasizing the current-voltage (I–V) dependence of $T_{Stress}$ on hot-electron degradation. Thus, the differential amplifier 24 will amplify any differential voltage that develops between the drains of $T_{Ref}$ and $T_{Stress}$ due to hot-electron effect degradation, and provide a signal to be used by a compensation circuit 19 to alter the operating parameters of the product 20 in some manner, such as increasing the power supply voltage to Vdd' to restore performance, decreasing the clock signal frequency to slow down the chip in step with its degraded capability, reducing the operating temperature of the product, or to signal that the part should be replaced.

A similar circuit as that shown in FIG. 1 and described above can be devised for p-type MOSFET (PFET) degradation monitoring simply by reversing the NFET and PFET in the circuit and reversing the power supply connections.

Figure 2:
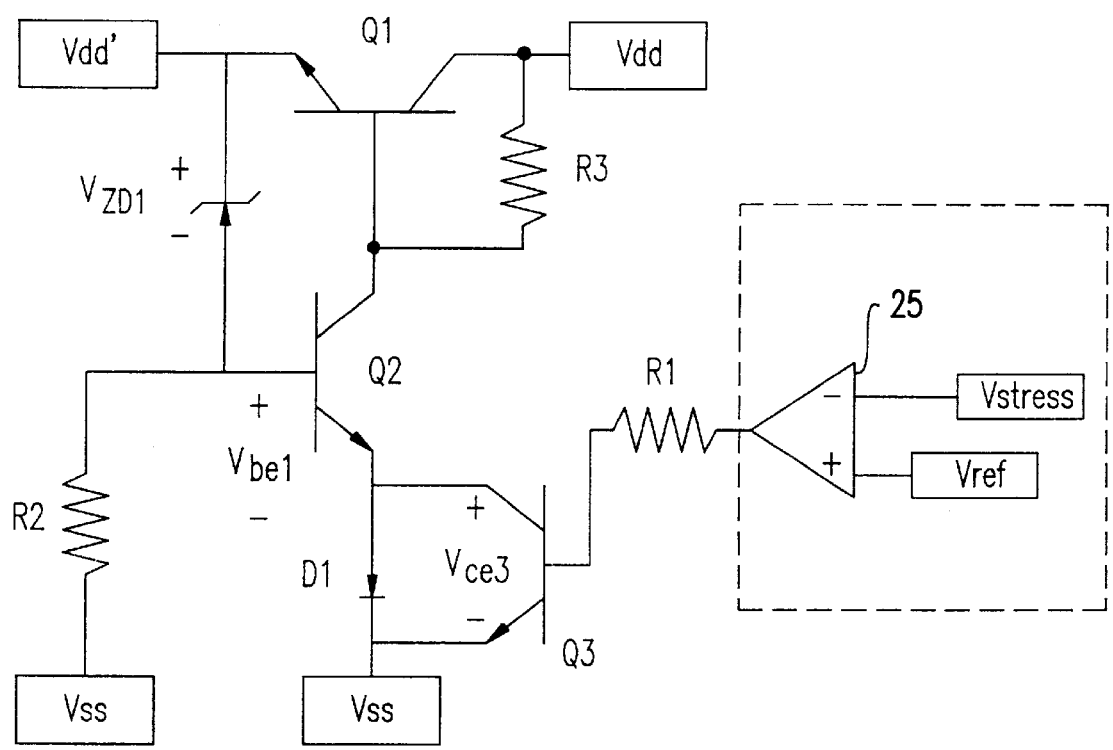
FIG. 2 is a circuit diagram for a supply voltage compensation circuit.

Referring now to FIG. 2, there is shown an exemplary power supply voltage compensation circuit 19 which can be used to adjust Vdd' to compensate for MOS degradation due to the hot-electron effect using the output of the monitor circuit shown in FIG. 1. Transistor Q1 is an NPN transistor which drops a main power supply Vin (Vin>Vout+2V) due to the feedback of the output voltage Vout over zener diode $Z_{D1}$ to transistor Q2. Transistor Q2 in turn regulates transistor Q1 by connecting to its base electrode. Resistors R2 and R3 are chosen to provide a stable operating point for this circuit.

The inverting input to comparator 25 V− receives the output $V_{Stress}$ of the differential amplifier 24 of FIG. 1. The non-inverting input V+ receives a reference voltage $V_{Ref}$ which is compared to $V_{Stress}$. The output of the comparator 25 is connected to the base of transistor Q3 through a resistor R1. The comparator 25 outputs positive voltage as long as its non-inverting input V+ is greater its inverting input V−. For example, the output of the comparator 25 will be tripped when, the device to be monitored 20 exceeds 10% device degradation as determined by the difference between $V_{Ref}$ and $V_{Stress}$. As a result, transistor Q3 conducts from its collector to emitter and short circuits diode D1. Thus, the emitter of transistor Q2 is nearly at ground (typically, ~0.2V). In this condition, Vdd' is equal to $V_{ZD1}+V_{bel}+V_{ce3}$ (~$V_{ZD1}$+0.7V+0.2V), where $V_{ZD1}$ is the zener diode regulating voltage, $V_{bel}$ is the base emitter drop of transistor Q1, and $V_{ce3}$ is the collector-emitter voltage drop of transistor Q3.

When V− exceeds V+ due to the hot-electron effect, the differential amplifier 24 will output 0V, thereby switching transistor Q3 off. As a result, the emitter of transistor Q2 will rise approximately 0.7V at which point the diode D1 will conduct. This increases $V_{out}$ to $V_{ZD1}+V_{bel}$+0.7V, or increase $V_{out}$ by 0.5V to compensate the performance capability.

While the invention has been described in terms of a single preferred embodiment, those skilled in the art will recognize that the invention can be practiced with modification within the spirit and scope of the appended claims.

We claim:

1. A device for compensating for degradation of a semiconductor device, comprising:

monitoring means for monitoring performance of the semiconductor device to a reference semiconductor device and for outputting a degradation signal; and compensation means for receiving said degradation signal and adjusting an operating parameter of said semiconductor device to compensate for degradation of said semiconductor device.

2. A device for compensating for degradation of a semiconductor device as recited in claim 1 wherein said compensation means comprises a supply voltage compensation circuit for adjusting a supply voltage to compensate for degradation of said semiconductor device.

3. A device for compensating for degradation of a semiconductor device as recited in claim 1 wherein said degradation is due to hot-electron effect.

4. A device for compensating for degradation of a semiconductor device, comprising:

monitoring means for monitoring performance of the semiconductor device to a reference and for outputting a degradation signal; and compensation means for receiving said degradation signal and adjusting an operating parameter of said semiconductor device to compensate for degradation of said semiconductor device, wherein said compensation means comprises adjusting a clocking rate to compensate for degradation of said semiconductor device.

5. A device for compensating for degradation of a semiconductor device, comprising:

monitoring means for monitoring performance of the semiconductor device to a reference and for outputting a degradation signal; and compensation means for receiving said degradation signal and adjusting an operating parameter of said semiconductor device to compensate for degradation of said semiconductor device, wherein said compensation means comprises a signal indicating that said semiconductor device should be replaced.

6. A device for compensating for degradation of a semiconductor device, comprising:

monitoring means for monitoring performance of the semiconductor device to a reference and for outputting a degradation signal; and compensation means for receiving said degradation signal and adjusting an operating parameter of said semiconductor device to compensate for degradation of said semiconductor device, wherein said monitoring means comprises:

a reference semiconductor device not subjected to degrading conditions comprising hot-electron effect;

a stressed semiconductor device which is subjected to degrading conditions comprising hot-electron effect;

a current mirror for supplying a current through said reference semiconductor device and said stressed semiconductor device; and comparator means for comparing said reference semiconductor device and said stressed semiconductor device and outputting said degradation signal.

7. A device for compensating for degradation of a semiconductor device as recited in claim 6 further comprising means for alternately connecting a gate of said stressed semiconductor device between a supply voltage and a stressing voltage.

8. A device for compensating for degradation of a semiconductor device as recited in claim 7 wherein said means for alternately connecting said gate of said stressed semiconductor device between said supply voltage and said stressing voltage comprises a transmission gate.

9. A circuit for managing the effects of hot-electron effect on a metal oxide semiconductor (MOS) transistor, comprising:

a stress MOS transistor having a gate electrode alternately connected between a MOS supply voltage and a stress inducing voltage;

a reference MOS transistor, manufactured with like operating parameters as said stressed MOS transistor, said reference MOS transistor having a gate electrode connected to said MOS supply voltage;

a comparator circuit for comparing a voltage difference across said stress MOS transistor and said reference MOS transistor, said voltage difference indicating a degradation of said MOS transistor due to the hot-electron effect.

10. A circuit for managing the effects of hot-electron effect on a metal oxide semiconductor (MOS) transistor as recited in claim 9 further comprising means for adjusting an operating parameter of said MOS transistor in response to said voltage difference to compensate for degradation due to the hot-electron effect.

11. A circuit for managing the effects of hot-electron effect on a metal oxide semiconductor (MOS) transistor as recited in claim 10 wherein said means for adjusting an operating parameter comprises a supply voltage compensation circuit for increasing a supply voltage to compensate for degradation due to the hot-electron effect.

12. A circuit for managing the effects of hot-electron effect on a metal oxide semiconductor (MOS) transistor as recited in claim 10 wherein said means for adjusting an operating parameter comprises means for modifying well biases of said MOS transistor to compensate for degradation due to the hot-electron effect.

13. A circuit for managing the effects of hot-electron effect on a metal oxide semiconductor (MOS) transistor as recited in claim 10 wherein said means for adjusting an operating parameter comprises means for reducing operating temperature of said MOS transistor to compensate for degradation due to the hot-electron effect.

14. A circuit for managing the effects of hot-electron effect on a metal oxide semiconductor (MOS) transistor as recited in claim 10 wherein said means for adjusting an operating parameter comprises reducing a clocking rate to compensate for degradation of said MOS transistor.

15. A circuit for managing the effects of hot-electron effect on a metal oxide semiconductor (MOS) transistor as recited in claim 10 wherein said means for adjusting an operating parameter comprises a signal that said MOS transistor should be replaced.

16. A circuit for managing the effects of hot-electron effect on a metal oxide semiconductor (MOS) transistor as recited in claim 11 wherein said supply voltage compensation circuit comprises:

a first bipolar transistor connected between said supply voltage and an increased supply voltage output terminal;

a second bipolar transistor connected between a base of said first bipolar transistor and a diode;

a zener diode connected between said increased supply voltage output terminal and a base of said second bipolar transistor; and a third bipolar transistor connected in parallel with said diode and having a base electrode connected to receive said voltage difference from said comparator circuit to short circuit said diode when as said stress MOS transistor begins to degrade from said hot-electron effect.

17. A method for managing the effects of hot-electron effect on a metal oxide semiconductor (MOS) device, comprising the steps of:

alternately connecting a stress MOS transistor between a non-stress inducing voltage and a stress inducing voltage;

connecting a reference MOS transistor to said non-stress inducing voltage;

comparing a voltage difference across said stress MOS transistor and said reference MOS transistor to output a difference signal indicative of degradation due to the hot-electron effect; and adjusting an operating parameter of said device degraded by the hot-electron effect according to said difference signal.

18. A method for managing the effects of hot-electron effect on a metal oxide semiconductor (MOS) device as recited in claim 17 wherein said step of adjusting an operating parameter comprises the step of increasing a supply voltage to said MOS device.

* * * * *